US008935447B2

(12) United States Patent
Martini et al.

(10) Patent No.: US 8,935,447 B2
(45) Date of Patent: Jan. 13, 2015

(54) WIRELESS ADAPTER FOR A MEASUREMENT DEVICE

(71) Applicant: Service Solutions U.S. LLC, Warren, MI (US)

(72) Inventors: Mario Martini, Parma (IT); Manokar Chinnadurai, Owatonna, MI (US); Marco Le Brun, Florence (IT)

(73) Assignee: Bosch Automotive Service Solutions LLC, Warren, MI (US)

( * ) Notice: Subject to any disclaimer, the term of this patent is extended or adjusted under 35 U.S.C. 154(b) by 0 days.

(21) Appl. No.: 13/801,794

(22) Filed: Mar. 13, 2013

(65) Prior Publication Data
US 2014/0281063 A1 Sep. 18, 2014

(51) Int. Cl.
*G06F 3/00* (2006.01)
*G06F 13/38* (2006.01)
*G06F 13/12* (2006.01)

(52) U.S. Cl.
CPC .................................. *G06F 13/385* (2013.01)
USPC ................. 710/63; 710/72; 710/15

(58) Field of Classification Search
None
See application file for complete search history.

(56) References Cited

U.S. PATENT DOCUMENTS

| 7,974,750 B2 | 7/2011 | Namaky |
| 2013/0117580 A1* | 5/2013 | Chin ............................ 713/300 |

OTHER PUBLICATIONS

Xilinx, Inc.: "Xilinx Automotive Zynq-7000 All Programmable SOCS," pp. 1-4, San Jose, CA., 2012.
USB Implementers Forum, Inc.: "USB Battery Charging 1.2 Compliance Plan," pp. 1-165, Oct. 12, 2011.

* cited by examiner

*Primary Examiner* — Zachary K Huson
(74) *Attorney, Agent, or Firm* — Baker & Hostetler LLP

(57) ABSTRACT

A wireless adapter for a measurement device is provided. The wireless adapter includes a first universal serial bus (USB) port to couplably receive data from the measurement device. The wireless adapter includes a battery to power the measurement device via the first USB port. the wireless adapter includes a wireless module to wirelessly transmit the received data to an external computing device after processing by the wireless adapter.

17 Claims, 2 Drawing Sheets

WIRELESS ADAPTER FOR A MEASUREMENT DEVICE

CROSS-REFERENCE TO RELATED APPLICATION

This application is related to U.S. patent application Ser. No. 13/801,346, entitled "VEHICLE MEASUREMENT APPARATUS HAVING A SYSTEM-ON-A-CHIP DEVICE AND A SENSOR," filed Mar. 13, 2013, which is incorporated by reference herein in its entirety.

FIELD OF THE DISCLOSURE

The present disclosure relates generally to diagnostic equipment and method. More particularly, the present disclosure relates to a wireless adapter for a measurement or diagnostic device.

BACKGROUND OF THE DISCLOSURE

A conventional measurement device (e.g., a vehicle oscilloscope or a multimeter), especially one that does not have built-in wireless capability, requires a wired connection to a personal computer (PC) for controlling the measurement device and displaying various waveforms and measured values. A typical use of the conventional measurement device is to locate problems in a vehicle, following a troubleshooting tree or procedure. In most cases, the conventional measurement device has to be connected to circuits or components under the hood of the vehicle, while the PC and the operator stay in the driver's seat.

Unfortunately, having such a wired connection of conventional measurement device to an external computer is unwieldy and not flexible (e.g., in the above-noted use scenario). In addition, the conventional measurement device has to be separately powered, which also adds to the unwieldiness of the conventional measurement device during measurements. These and other problems, which have been identified by the inventors, exist in conventional systems. Thus there is a need for a wireless adapter for a measurement device.

SUMMARY OF THE INVENTION

According to one embodiment, a wireless adapter for a measurement device is provided. The wireless adapter includes a first universal serial bus (USB) port to couplably receive data from the measurement device. The wireless adapter includes a battery to power the measurement device via the first USB port. the wireless adapter includes a wireless module to wirelessly transmit the received data to an external computing device after processing by the wireless adapter.

According to one embodiment, a method for wirelessly transmitting vehicle data is provided. The method includes receiving, at a wireless adapter coupled to an oscilloscope, the vehicle data from the oscilloscope. The method includes processing, at the wireless adapter, the received vehicle data. The method includes transmitting wirelessly, from the wireless adapter, the processed vehicle data to an external computing device. The method includes powering the oscilloscope from the wireless adapter.

There has thus been outlined, rather broadly, certain embodiments in order that the detailed description thereof herein may be better understood, and in order that the present contribution to the conventional art may be better appreciated. There are, of course, additional embodiments of the invention that will be described below, which will form the subject matter of the claims appended hereto.

In this respect, before explaining at least one embodiment in detail, it is to be understood that the disclosure is not limited in its application to the details of construction and to the arrangements of the components set forth in the following description or illustrated in the drawings. The disclosure is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, apparatii, methods and systems for carrying out the several purposes of the present disclosure. It is important, therefore, that the claims be regarded as including such equivalent constructions insofar as they do not depart from the spirit and scope of the present disclosure.

DETAILED DESCRIPTION

Figure 1:
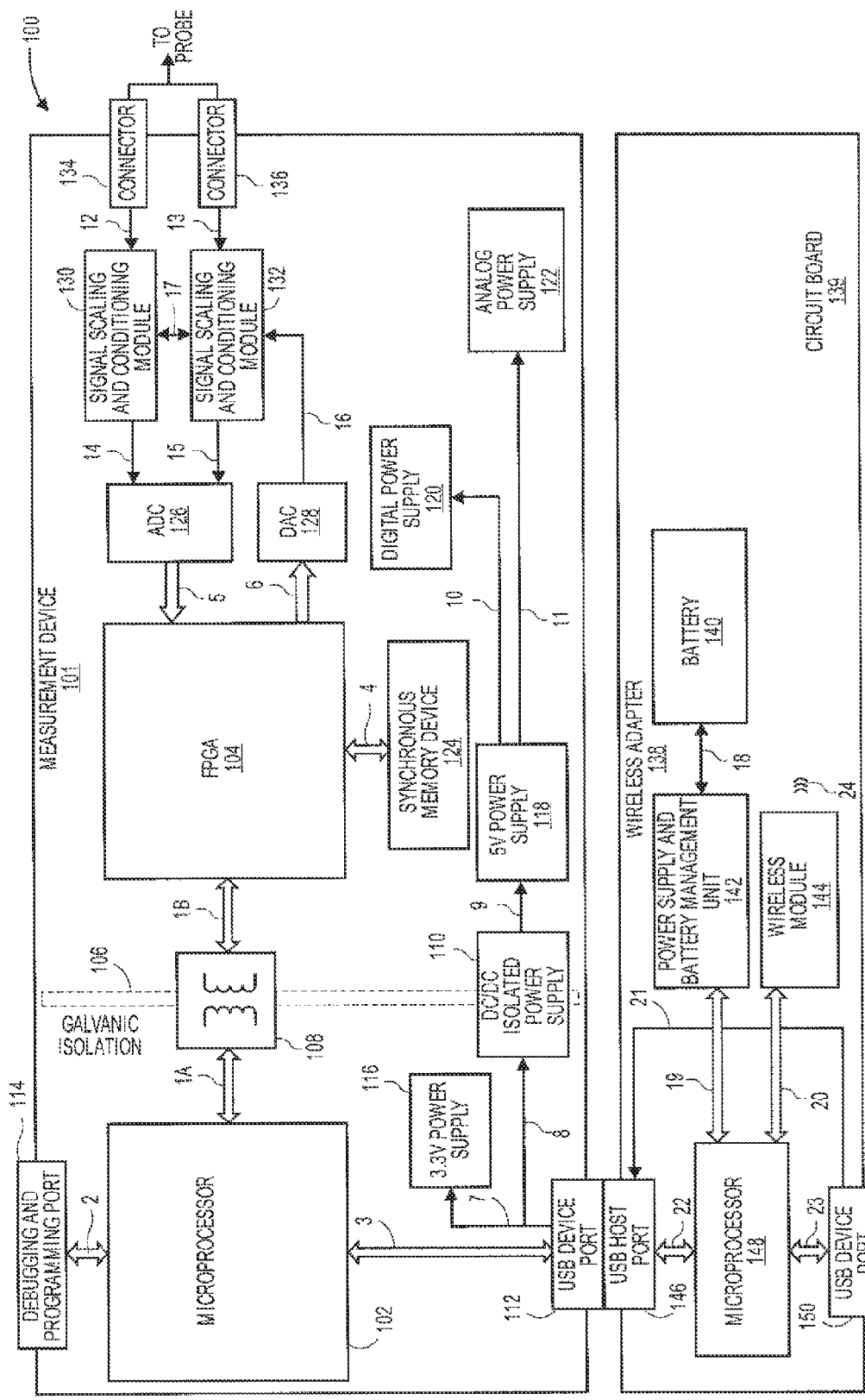
FIG. 1 is a schematic block diagram illustrating a wireless adapter system for a measurement device, in accordance with an embodiment of the present disclosure.

Referring to FIG. 1, a schematic block diagram of a wireless adapter system 100 is illustrated, in accordance with an embodiment of the present disclosure. Wireless adapter system 100 includes a measurement device 101 and a wireless adapter 138. Measurement device 101 and wireless adapter 138 may be coupled to each other.

Measurement device 101 may be interchangeably referred to herein as measurement apparatus 101. In one embodiment, measurement device 101 may be a scan tool, an oscilloscope, an electronic multi-meter, or other types of devices used for measuring data associated with a machine (e.g., a vehicle). Measurement device 101 includes a microprocessor 102 in electrical communication with a field programmable gate array (FPGA) 104. Microprocessor 102 may be separated from FPGA 104 by a galvanic isolation 106. Galvanic isolation 106 may be connected to or coupled to a transformer 108 (interchangeably referred to herein as an optical or magnetic coupler 108), which couples microprocessor 102 with FPGA 104 electrically. Microprocessor 102 can be connected to transformer 108 by a connection 1A, and to FPGA 104 by a connection 1B. A side of galvanic isolation 106 that includes FPGA 104 and other components forms a mixed-signal portion of measurement device 101 having analog and digital components. Another side of galvanic isolation 106 that includes microprocessor 102 forms a digital portion of measurement device 101.

The digital portion of measurement device 101 may include a debugging and programming port 114 coupled to microprocessor 102 by a connection 2. Microprocessor 102 can be coupled to a universal serial bus (USB) port 112 by a connection 3. USB port 112 may be coupled to a 3.3V power supply 116 by a connection 7, and to a direct current-to-direct current (DC/DC) isolated power supply 110 by a connection 8. Measurement device 101 may include other electrical or electronic components in the digital portion, in addition to the components described above. In one embodiment, USB port 112 can couple to other external USB ports or cables, and may be used to couple other devices to measurement device 101.

The mixed-signal portion of measurement device 101 may include a 5V power supply 118 coupled to DC/DC isolated power supply 110 by a connection 9. 5V power supply 118 may further be coupled to a digital power supply 120 by a connection 10, and to an analog power supply 122 by a connection 11. Connectors 134 and 136 may be connected to an external probe (not shown). Connectors 134 and 136 are also coupled to signal scaling and conditioning modules 130 and 132, respectively, by connections 12 and 13, respectively. Connections 12 and 13 carry analog data received from the probe (not shown) that is placed on one or more parts of a machine (not shown). Such a machine may be a vehicle (e.g., a car), or any other machine that is to be tested. For example, a vehicle engine may be tested for parameters such as vibrations, emissions, engine speed, acceleration, or other parameters, using the probe that is placed on a portion of the vehicle's engine. Such parameters may be referred to as vehicle data herein. The probe then provides analog signals to connectors 134 and 136 corresponding to the parameter(s) under consideration. Signal scaling and conditioning modules 130 and 132 may be coupled to each other by a connection 17. Signal scaling and conditioning modules 130 and 132 may be both coupled to an analog to digital converter (ADC) 126 by connections 14 and 15, respectively. ADC 126 may be coupled to FPGA 104 by a connection 5. FPGA 104 may be coupled to a digital to analog converter (DAC) 128 by a connection 6. DAC 128 may be further coupled to signal scaling and conditioning module 132 by a connection 16. FPGA 104 may be coupled to a synchronous memory device 124 by a connection 4.

It is to be noted that in one embodiment, internal components of measurement device 101 may have a different arrangement and design. By way of example only and not by way of limitation, measurement device 101 may be similar to a vehicle measurement apparatus shown in FIG. 2 of the above-referenced U.S. patent application Ser. No. 13/801,346, entitled "VEHICLE MEASUREMENT APPARATUS HAVING A SYSTEM-ON-A-CHIP DEVICE AND A SENSOR," filed Mar. 13, 2013, which is incorporated by reference herein in its entirety. Further, wireless adapter system 100 may include other types of measurement devices couplable to wireless adapter 138, as may be contemplated by one of ordinary skill in the art, and the description herein of measurement device 101 is by way of example only, and not by way of limitation. For example, in one embodiment, measurement device 101 may be an electronic multi-meter or an electronic scan tool coupled to wireless adapter 138. As such, without the wireless adapter 138, the measurement device 101 needs a wired connection to an external computing device to transfer or transmit the measured machine data. Such a cable or wired connection makes measurement device 101 and its operation unwieldy and cumbersome.

In one embodiment, wireless adapter 138 is a device that is couplable to measurement device 101. Wireless adapter 138 forms an interface that transmits data wirelessly between measurement device 101 and the external computing device. For example, measurement device 101 may be placed upon an outside body of wireless adapter 138. For example, the outside body of wireless adapter 138 is shaped or has a shape that can accommodate measurement device 101. Such accommodation may be in the form of measurement device 101 docking to wireless adapter 138. For example, the outside body of wireless adapter 138 may have a receptacle to latch measurement device 101. The outside body of wireless adapter 138 may be made of a soft material to cradle measurement device 101. Alternatively, the outside body of measurement device 101 may be shaped or has a shape that can accommodate wireless adapter 138, for example, via a receptacle. In one embodiment, wireless adapter 138 is couplable to measurement device 101 at USB port 112. For example, wireless adapter 138 may be inserted as a peripheral device to measurement device 101 at USB port 112. Wireless adapter 138 may have one or more display devices on an outside body thereof. For example, a light emitting diode (LED), or a 7-segment display (both not shown) may indicate to a user of wireless adapter 138 a charge status of a battery 140 therein, or operating conditions such as transmission and reception. Additionally, wireless adapter 138 may include one or more switches on the outside for switching wireless adapter 138 on and off.

In one embodiment, wireless adapter 138 includes a circuit board 139 having battery 140, a power supply and battery management unit 142, a wireless module 144, a USB host port 146, a microprocessor 148, and a USB device port 150. For example, circuit board 139 may be a printed circuit board (PCB). Battery 140 may be coupled to power supply and battery management unit 142 by a connection 18 on circuit board 139. Power supply and battery management unit 142 may be coupled to microprocessor 148 by a connection 19 on circuit board 139. Wireless module 144 may be coupled to microprocessor 148 by a connection 20 on circuit board 139. USB host port 146 may be coupled to microprocessor 148 by a connection 22 on circuit board 139 while USB device port 150 may be coupled to microprocessor 148 by a connection 23 on circuit board 139. USB device port 150 is coupled to USB host port 146 by a connection 21 on circuit board 139.

In one embodiment, battery 140 is chargeable through USB device port 150 over connection 21 via connection 18. For example, battery 140 is chargeable at a rate of up to 1.5 A through USB device port 150, in accordance with "USB Battery Charging 1.2 Compliance plan" by USB Implementers Forum Inc., dated Oct. 12, 2011. In one embodiment, battery 140 supplies power to wireless adapter 138 internally. In one embodiment, battery 140 can supply power to measurement device 101 through USB host port 146. For example, when measurement device 101 is used as a mobile or portable device, or when the mains supply power is not available to measurement device 101, battery 140 can provide power to measurement device 101. In one embodiment, battery 140 may be couplable to one or more external batteries that may be attached to the outside body of wireless adapter 138. Such external batteries may increase the charge providing capability of battery 140, and thus, of wireless adapter 138 to power itself and/or measurement device 101. By way of example only, battery 140 may be a Lithium ion battery or a Lithium polymer type battery, although other types of batteries known to one of ordinary skill in the art may be used (e.g., Nickel-Cadmium battery).

In one embodiment, power supply and battery management unit 142 is configured to control power supplied to wireless adapter 138. In one embodiment, power supply and battery management unit 142 may be configured to manage charging current received from USB device port 150 to charge battery 140. Such a charging current may be received from an external computing device (e.g., a personal computer) coupled at USB device port 150 over connection 21. In one embodiment, power supply and battery management unit 142 manages power supply from battery 140 and/or an external power source to measurement device 101 via USB host port 146 using microprocessor 148, or directly (not shown). Power supply and battery management unit 142 may receive instructions to intelligently manage power distribution in circuit board 139 from an external computing device via USB device port 150 or from microprocessor 148, or both. Power supply and battery management unit 142 may include one or more switches to electronically toggle between power from an external computing device, battery 140, and a mains power supply.

In one embodiment, wireless module 144 includes circuitry and antenna to implement wireless communication with an external computing device (not shown). By way of example only, wireless module 144 may be a Bluetooth wireless communication protocol device, a WiFi™ wireless communication protocol device, a near field communication device, or other wireless communication device known to one of ordinary skill in the art. An advantage of using the Bluetooth protocol is that it is simpler to implement and has lower power requirements as compared to WiFi® protocol. However, as known to one of ordinary skill in the art, WiFi® protocol is more secure. Wireless module 144 may receive measured vehicle data (e.g., automotive data), after processing by microprocessor 148, from measurement device 101 via USB host port 146 coupled to USB port 112 of measurement device 101. Wireless module 144 then initiates and maintains a transmission 24 to wirelessly transmit the processed data to an external computing device (e.g., a personal computer). By way of example only, wireless module 144 may be implemented using RN-42® or RN-230® wireless modules provided by Roving Networks, Inc. of Los Gatos, Calif., although other types of wireless modules from other manufacturers could be used.

In one embodiment, microprocessor 148 is configured to execute computer executable instructions residing in a non-transitory memory (not shown) of wireless adapter 138. When executed, the computer executable instructions cause microprocessor 148 to carry out various features and functionalities of the embodiments discussed herein. For example, microprocessor 148 may carry out one or more operations of a method 200 discussed in FIG. 2. Microprocessor 148 is interchangeably referred to herein as microprocessor 148. In one embodiment, microprocessor 148 is configured to process the received data from measurement device 101. The processed data may be sent to wireless module 144 over connection 20 for wireless transmission. In one embodiment, microprocessor 148 may transmit the processed data over a USB cable (not shown) attached to USB device port 150. The USB cable may further couple to an external computing device. Such wired communication from microprocessor 148 may occur in addition to or as an alternative to wireless communication of processed data by wireless module 144. By way of example only, microprocessor 148 may be an R5F10JBCAFP® processor provided by Renesas Electronics Corporation of Santa Clara, Calif., although other types of processors from other manufacturers could be used.

In one embodiment, USB host port 146 couples to USB port 112 of measurement device 101 and USB host port 146 may provide power to measurement device 101. Such power may be received from battery 140, an external computing device, a mains power supply, or combinations thereof. For example, one or more pins/connection points of USB host port 146 may provide an electrical signal to corresponding one or more pins/connection points of USB port 112 to power measurement device 101. In one embodiment, in addition to power transfer signals, USB host port 146 may receive data from measurement device 101. Similarly, USB host port 146 may transmit data to measurement device 101, for example, control signals, etc., from microprocessor 148, the external computing device, or both.

Likewise, in one embodiment, USB device port 150 couples to one or more external computing devices. In one embodiment, USB device port 150 may receive an electrical current to charge battery 140 from the external computing device. Additionally or alternatively, USB device port 150 may receive updates or other instructions from the external computing device for wireless adapter 138, measurement device 101, or both. Further, USB device port 150 may transmit various data related to functioning of wireless adapter 138, measurement device 101, or both to the external computing device, for example, for debugging. In one embodiment, USB device port 150 may be optional, e.g., when wireless adapter 138 receives power from a power supply.

In one embodiment, connections 18-23 are traces on circuit board 139. Bi-directional arrows are used to indicate full-duplex communications or signal flows. Unidirectional arrows indicate simplex communications or signal flows. It is to be noted that circuit board 139 may have other additional connections, not shown, depending on additional components placed thereupon.

In addition to the components listed above, wireless adapter 138 and/or wireless adapter system 100 may have other electronic or mechanical components such as heat sinks, insulation, screws, latches, etc. Further, wireless adapter 138 and/or wireless adapter system 100 may have other serial and parallel interface, including but not limited to Universal Asynchronous Receiver/Transmitter (UART), Common System Interface (CSI), Inter-Integrated Circuit (I2C) buses, an interface to connect to an on-board diagnostics port (e.g., an OBD II port) of a vehicle, etc., known to those of ordinary skill in the art. In one embodiment, a power inlet may provide mains power to wireless adapter 138 and/or wireless adapter system 100. For example, such a power inlet may be located at an outside surface of the body of wireless adapter 138 with an interface coupling to circuit board 139 for scaling and/or conditioning the supplied power to values suitable for wireless adapter 138. The power inlet may operate in conjunction with or independent of battery 140 to power wireless adapter 138, measurement device 101, or both.

Figure 2:
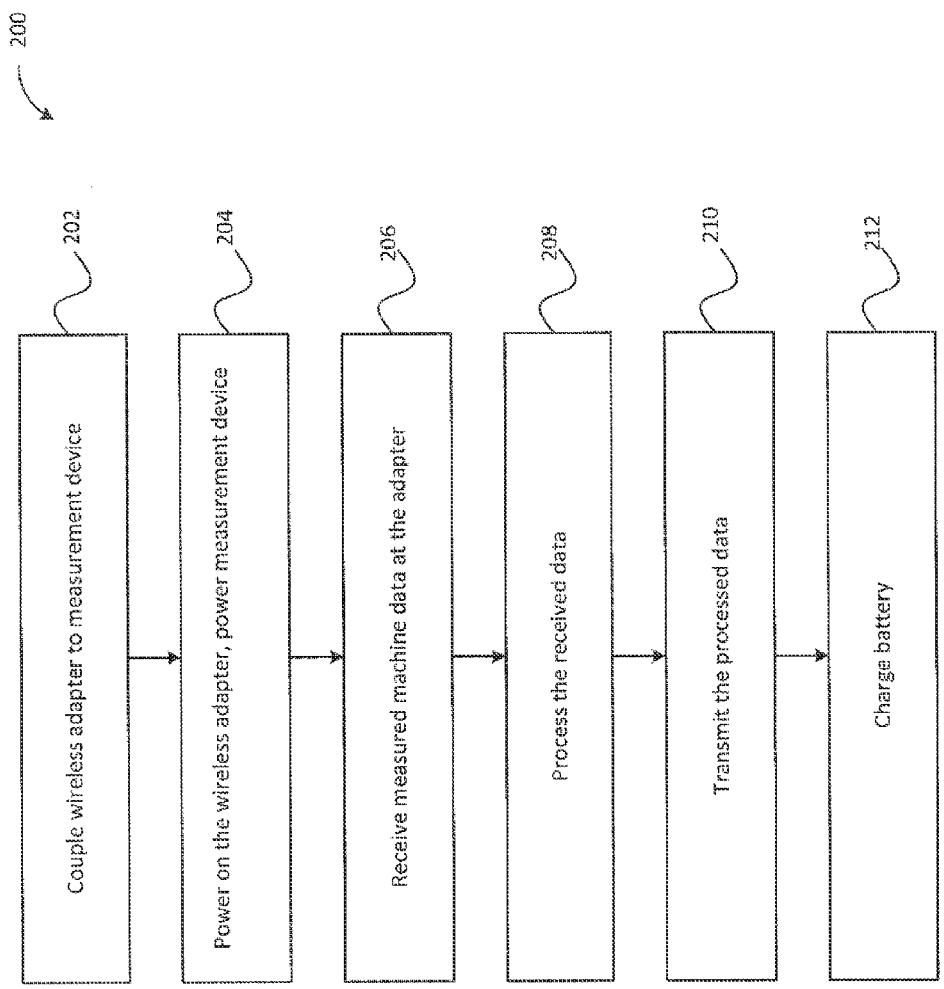
FIG. 2 is a flowchart for a method for wirelessly transmitting machine or vehicle data, in accordance with an embodiment of the present disclosure.

Referring to FIG. 2, method 200 for wirelessly transmitting machine data (e.g., vehicle data) using wireless adapter 138 is illustrated as a flowchart, in accordance with an embodiment. It is to be noted that although the operations shown in the flowchart of method 200 are in an increasing order, such operations are not restricted to any particular order. For example, the operations can be carried out independently, may be combined as a single operation, or may be optional under certain conditions, as will be apparent to one of ordinary skill in the art in view of the present disclosure.

In one embodiment, method 200 may begin in an operation 202. In operation 202, wireless adapter 138 is coupled to measurement device 101. Coupling of wireless adapter 138 to measurement device 101 may occur by placing measurement device 101 in a receptacle on an outside body of wireless adapter 138. For example, such a receptacle on the outside surface of the body of wireless adapter 138 may be shaped to accommodate measuring device 101. Alternatively, coupling may occur by placing wireless adapter 138 to a receptacle on the outside surface of the body of measurement device 101. Coupling between wireless adapter 138 and measurement device 101 may occur by a direct connection between USB host port 146 and USB port 112 of wireless adapter 138 and measurement device 101, respectively. For example, USB host port 146 and USB port 112 may be a male-female type pair of USB ports to connect wireless adapter 138 with measurement device 101.

In one embodiment, in an operation 204, wireless adapter 138 is powered on. Powering wireless adapter 138 to turn on includes providing power internally to wireless adapter 138 using battery 140. In one embodiment, powering wireless adapter 138 may occur by connecting wireless adapter 138 to a power supply, e.g., a mains power supply. For example, a switch on an outside body of wireless adapter 138 may be flipped on to power wireless adapter 138. In one embodiment, powering wireless adapter 138 may occur by wireless adapter 138 receiving power from USB device port 150 connected to a power source (not shown). In one embodiment, the power source may be an external computing device or a power source of the external computing device. In one embodiment, microprocessor 148 may send signals to power supply and battery management unit 142 to intelligently switch between various powering schemes for wireless adapter 138. In one embodiment, powering wireless adapter 138 may include powering measurement device 101 through wireless adapter 138. For example, power from wireless adapter 138 (e.g., from battery 140) may be provided to measurement device 101 over USB host port 146. Likewise, when wireless adapter 138 is being powered by an external source, e.g., an external computing device, wireless adapter 138 may direct some of the power received from the external source to power measurement device 101 via USB host port 146. For example, power supply and battery management unit 142 may be used to direct a portion of the received power (e.g., from battery 140 and/or the external power source) to measurement device 101 to obtain vehicle data therefrom. In one embodiment, such power provided to measurement device 101 via wireless adapter 138 may be used before, during, or after measurement device 101 has provided vehicle data to wireless adapter 138.

In one embodiment, in an operation 206, wireless adapter 138 receives measured machine data (e.g., vehicle data) from measurement device 101. Measured machine data from measurement device 101 may be obtained at USB host port 146 of wireless adapter 138. For example, such received data may be in digitized packet format after being processed by microprocessor 102. Data received from measurement device 101 is forwarded to microprocessor 148 over connection 22. In one embodiment, such receiving of data from measurement device 101 may occur in real-time, as measurements of machine parameters are being made by measurement device 101. Alternatively, such receiving may occur offline after measurement device 101 has measured machine parameters to provide the measured machine parameters to wireless adapter 138.

In one embodiment, in an operation 208, received machine data at wireless adapter 138 is processed at microprocessor 148. Such processing includes modifying digital packets of measured data into a format suitable for wireless transmission by wireless module 144. Other operations such as data integrity, encryption, redundancy, etc. may be performed on the received data by microprocessor 148 as part of the processing. For example, the processing may include converting the received digital packets of machine data to a format suitable for wired transmission from USB device port 150 to an external computing system. In one embodiment, processing of received data by microprocessor 148 includes executing computer executable code residing in a memory (e.g., an internal memory of microprocessor 148) to process the received data.

In one embodiment, in an operation 210, processed data is transmitted wirelessly by wireless module 144 over transmission 24. As discussed herein, such wireless transmission may occur using the Bluetooth or the WiFi® protocol, although other types of wireless protocols may be used. In one embodiment, such transmitting may be carried out over a wired channel (e.g., a USB cable) attached to USB device port 150. In one embodiment, wireless adapter 138 may carry out such transmitting both wirelessly and over a wired channel for redundancy, or for transmitting to multiple external computing devices (e.g., PCs, mobile phones, etc.). In one embodiment, transmitting the processed data by wireless adapter 138 over a wired channel is independent of wireless transmission 24.

In one embodiment, in an operation 212, battery 140 may be charged. Charging may occur using the external computing device through USB device port 150. For example, USB device port 150 may transfer a charging current of up to 1.5 A from the external computing device over connection 21 to power supply and battery management unit 142. Power supply and battery management unit 142 may provide the charging current to battery 140 over connection 18. In one embodiment, charging battery 140 may occur over USB host port 146. USB host port 146 may receive charging current from measurement device 101. For example, measurement device 101 may be coupled to a direct mains power supply, and may charge battery 140. In one embodiment, battery 140 may be charged from a plurality of sources, or a combination of different power sources connecting at USB host port 146, USB device port 150, or both.

By way of example only, advantageously, various embodiments discussed herein eliminate the need for having a wired connection between measurement device 101 and an external computing system where measured data from measurement device 101 may be processed or analyzed. For example, measurement device 101 may be an oscilloscope with a probe under a hood of a car. By coupling wireless adapter 138 to such an oscilloscope, a user located away from and outside the hood of the car may wirelessly receive measured machine data (e.g., engine speed, acceleration, vibration, etc.) at a laptop or other computer. Further, using battery 140, for example, wireless adapter 138 may power the oscilloscope, eliminating the need for other wires to power the oscilloscope. Various embodiments of the disclosure discussed herein enable wireless adapter system 100 to free a user from worrying about placing wires from measurement device 101 in a corrosive environment (e.g., a hot machine part) that may damage the wires. Additionally, multiple recipients can obtain measured data wirelessly from wireless adapter 138 for analysis or parallel processing thereat.

The many features and advantages of the embodiments discussed herein are apparent from the detailed specification, and thus, it is intended by the appended claims to cover all such features and advantages which fall within the true spirit and scope of the embodiments. Further, since numerous modifications and variations will readily occur to those skilled in the art, it is not desired to limit the exact construction and operation illustrated and described, and accordingly, all suitable modifications and equivalents may be resorted to, falling within the scope of the embodiments in the present disclosure.

What is claimed is:

1. A wireless adapter for a measurement device, comprising:
    a first universal serial bus (USB) port to couplably receive data from the measurement device;
    a battery that powers the measurement device via the first USB port;
    a wireless module to wirelessly transmit the received data to an external computing device after processing by the wireless adapter;
    a processor coupled to the first USB port, the processor processes the received data; and a power supply and management unit coupled to the first USB port, wherein the battery and an external power source are coupled to the power supply and management unit to power the wireless adapter and send a portion of the power from the external power source to the measurement device to obtain data.

2. The wireless adapter of claim 1, wherein the battery is a Lithium ion or a Lithium polymer type battery.

3. The wireless adapter of claim 1 further comprising:
a second USB port coupled to the processor to communicate with the external computing device over a USB cable.

4. The wireless adapter of claim 3, wherein the battery inside the wireless adapter is chargeable through the second USB port.

5. The wireless adapter of claim 1, wherein an outside body of the wireless adapter is configured to have the measurement device placed thereupon.

6. The wireless adapter of claim 1, wherein the wireless module is a Bluetooth or a WiFi® protocol device.

7. The wireless adapter of claim 1, wherein the first USB port couples to a USB port of the measurement device to receive the data.

8. The wireless adapter of claim 1, wherein at least a part of an outside body of the wireless adapter is made of a soft material to cradle the measurement device.

9. A method for wirelessly transmitting vehicle data, comprising:
receiving, at a wireless adapter coupled to an oscilloscope, the vehicle data from the oscilloscope;
processing, at the wireless adapter, the received vehicle data;
transmitting wirelessly, from the wireless adapter, the processed vehicle data to an external computing device; and
powering the oscilloscope, with a power supply and management unit of the wireless adapter, the power supply and management unit being coupled to a first USB port, and receives power from a battery and an external power supply, wherein powering includes sending a portion of the power from the external power supply to the oscilloscope to obtain the received data.

10. The method of claim 9, wherein the powering using the battery is carried out internal to the wireless adapter.

11. The method of claim 9, further comprising:
charging the battery in the wireless adapter with the external power supply.

12. The method of claim 11, wherein the charging is carried out through a universal serial bus (USB) port to provide a charge to the battery.

13. The method of claim 9, wherein the powering the oscilloscope is carried out during the receiving of the vehicle data.

14. The method of claim 9, wherein the transmitting comprises:
transmitting the processed received vehicle data using a Bluetooth or a WiFi® protocol of a wireless module in the wireless adapter.

15. The method of claim 9 further comprising:
placing the oscilloscope in a receptacle on an outside body of the wireless adapter to perform the powering.

16. The method of claim 9 further comprising:
transmitting the processed received vehicle data over a wired channel independent of the wirelessly transmitted processed received vehicle data.

17. A wireless adapter system, comprising:
a measurement device; and
a wireless adapter coupled to the measurement device and configured to:
couplably receive data from the measurement device at a first universal serial bus (USB) port;
process the received data at a processor in the wireless adapter;
transmit the processed received data to an external computing device through a wireless module in the wireless adapter; and
power the measurement device with a power supply and management unit being coupled to the first USB port, and that receives power from a battery and an external power supply, wherein power includes sending a portion of the power to the measurement device to obtain the received data.

* * * * *